(12) United States Patent
Coulman et al.

(10) Patent No.: US 6,232,798 B1
(45) Date of Patent: May 15, 2001

(54) SELF-RESETTING CIRCUIT TIMING CORRECTION

(75) Inventors: Paula Kristine Coulman; Sang Hoo Dhong, both of Austin, TX (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/457,938

(22) Filed: Dec. 9, 1999

(51) Int. Cl.[7] .................. H03K 19/00; H03K 19/096; H03L 7/00
(52) U.S. Cl. .................. 326/93; 326/93; 326/95; 326/98; 326/121; 327/141; 327/142
(58) Field of Search .................. 326/93, 95, 98, 326/121; 327/141, 142

(56) References Cited

U.S. PATENT DOCUMENTS 5,467,037 * 11/1995 Kumar et al. .................. 327/142
5,870,411 * 2/1999 Durham et al. .................. 371/22.5
6,133,758 * 10/2000 Durham et al. .................. 326/93

\* cited by examiner

*Primary Examiner*—Michael Tokar
*Assistant Examiner*—Vibol Tan
(74) *Attorney, Agent, or Firm*—Casimer K. Salys; Felsman, Bradley, Vaden, Gunter & Dillon, LLP

(57) ABSTRACT

A system and method with a self-reset circuit for synchronizing an input data path with a timing control path. The self-resetting circuit includes a normal-mode input detect circuit which detects an arrival of data from the input data path into the self-reset circuit and generates a normal-mode control signal in response thereto. The self-resetting circuit also includes a delay-mode input detect circuit for detecting the arrival of the data from the input data path and which generates a delay-mode control signal in response thereto. A toggle circuit is provided for disabling the normal-mode input detect circuit while simultaneously enabling the delay-mode input detect circuit. In response to the toggle circuit disabling the normal-mode input detect circuit, the delay-mode control signal propagates through a delay gate, such that said delay-mode control signal synchronizes said timing control path with respect to said data input path.

14 Claims, 3 Drawing Sheets

SELF-RESETTING CIRCUIT TIMING CORRECTION

BACKGROUND OF INVENTION

1. Technical Field

The present invention relates in general to timing control within self-resetting circuitry and in particular to a system and method for providing selectable timing delay modes for self-resetting logic. More particularly, the present invention relates to adjusting the control path delay for self-resetting timing signals in response to process and structural variations and anomalies.

2. Description of the Related Art

Self-resetting logic circuitry was designed in part to eliminate the need to utilize a system clock signal with which to correctly synchronize all logic operations within very large scale integrated (VLSI) circuitry. Such self-resetting circuitry has generally been implemented utilizing Complementary Metal Oxide Semiconductor (CMOS) technology and is thus commonly referred to as SRCMOS. Further background information relating to self-resetting logic circuitry may be found with reference to U.S. Pat. No. 5,434,519, U.S. Pat. No. 5,565,798, and U.S. Pat. No. 5,329,176 which are incorporated herein by reference.

The timing signals generated by self-resetting logic techniques are characterized by having a fixed timing with respect to the input signals (often data input) which cause the triggering of self-reset circuits. Such fixed-timing signals are useful for internal clocking or strobing. When a self-reset initiated signal is utilized as a strobe (within a Programmable Logic Array (PLA) control module, for example) is it necessary to maintain the control path properly synchronized with related logic data transfer (the data path).

The self-timing characteristics of self-resetting logic suffers from the increased complexity of uncertain data signal arrival and pulse widths which may result from process variations or structural anomalies. These problems may be manageable under limited conditions where all signal interfaces are well-behaved, such as within a single macro or unit (an adder or SRAM, for example). However, when self-resetting logic is applied across a large and complex environment, such as within a microprocessor, the design environment is greatly complicated by noise, voltage differences, process variations, variability of inter-macro/unit wiring, etc. These complications may result in an unmanageable problem for synchronizing data and control paths within self-resetting interfaces across a chip design.

FIG. 1 depicts a conventional input detect circuit 100 for self-resetting (SR) CMOS circuitry. As is typical of SRCMOS circuitry, input detect circuit 100 is an edge detector for detecting dynamic logic input data. As seen in FIG. 1, input detect circuit 100 is constructed as a dynamic logic circuit having a pre-charge transistor 102 and an n-input NOR pull-down network 105, wherein n is the number of bits from bit (0) 106 through bit (n) 108. Pre-charge input detect node 110 is pre-charged to $V_{dd}$ 118 by pre-charge transistor 102, and conditionally discharged by foot transistor 107 upon receipt of one or more data bits from input data path 114.

When either a "True" or "Complement" of one or more of the input data 114 arrives, pre-charge input detect node 110 goes from high (pre-charged) to a logic low. A control path 124 is provided by an even number inversion module 125 which is comprised of inverters 120 and 122. Within control path 124 the arrival of data results in node 112 going high and reset node 104 going low and resetting the input NOR gate embodying pull-down network 105. This resetting of node 104 results in pre-charge transistor 102 being recharged such that input pre-charge input detect node is reset to a logic high after a fixed delay interval which demarcates the time span of control signal 116 as depicted in FIG. 1. The time delay through control path 124 is determined by the design of even number inversion module 125.

Since this self-resetting event is triggered by the arrival of incoming data 114, the generated signals at nodes 112 and 104 can be utilized to control or time other circuits that also accept incoming data 114. For example, the signal generated at node 112 may be utilized as a strobe signal in a PLA AND plane. The delay from the arrival of incoming data 114 to the generated strobe signal at node 112 is fixed. Therefore, any unexpected variation, such as a process variation, which causes the delay through control path 124 to depart from the designed delay may cause a collision between incoming data 114 and control signal 116. Due to the fixed nature of the timing utilized by self-resetting logic circuitry such as that illustrated in FIG. 1, it is difficult to correct the problem within the hardware itself.

From the foregoing it can be appreciated that a need exists for a system and method which provide multiple timing modes within self-resetting circuits to ensure that process variations and hardware anomalies do not result in disruption of proper timing and operation within such self-resetting circuits.

SUMMARY OF THE INVENTION

It is therefore one object of the present invention to provide a system and method for providing selectable timing delay modes for self-resetting logic.

It is another object of the present invention to provide a system and method for adjusting the control path delay for self-resetting timing signals in response to process and structural variations and anomalies.

Some or all of the foregoing objects may be achieved in one embodiment of the present invention as is now described. A system and method with a self-reset circuit for synchronizing an input data path with a timing control path are disclosed. The self-resetting circuit includes a normal-mode input detect circuit which detects an arrival of data from the input data path into the self-reset circuit and generates a normal-mode control signal in response thereto. The self-resetting circuit also includes a delay-mode input detect circuit for detecting the arrival of the data from the input data path and which generates a delay-mode control signal in response thereto. A toggle circuit is provided for disabling the normal-mode input detect circuit while simultaneously enabling the delay-mode input detect circuit. In response to the toggle circuit disabling the normal-mode input detect circuit, the delay-mode control signal propagates through a delay gate, such that said delay-mode control signal synchronizes said timing control path with respect to said data input path.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF ILLUSTRATIVE EMBODIMENT

In the following description, numerous specific details are set forth regarding component parts, interconnections, etc. to provide a thorough understanding of how a preferred embodiment of the present invention may be implemented. However, those skilled in the art will appreciate and understand the extensions necessary to practice the present invention without being limited to such application-specific details. Most details related specific timing parameters and the like have been omitted inasmuch as such details are not necessary to obtain a complete understanding of the present invention and are within the knowledge of those skilled in the relevant art.

Figure 1:
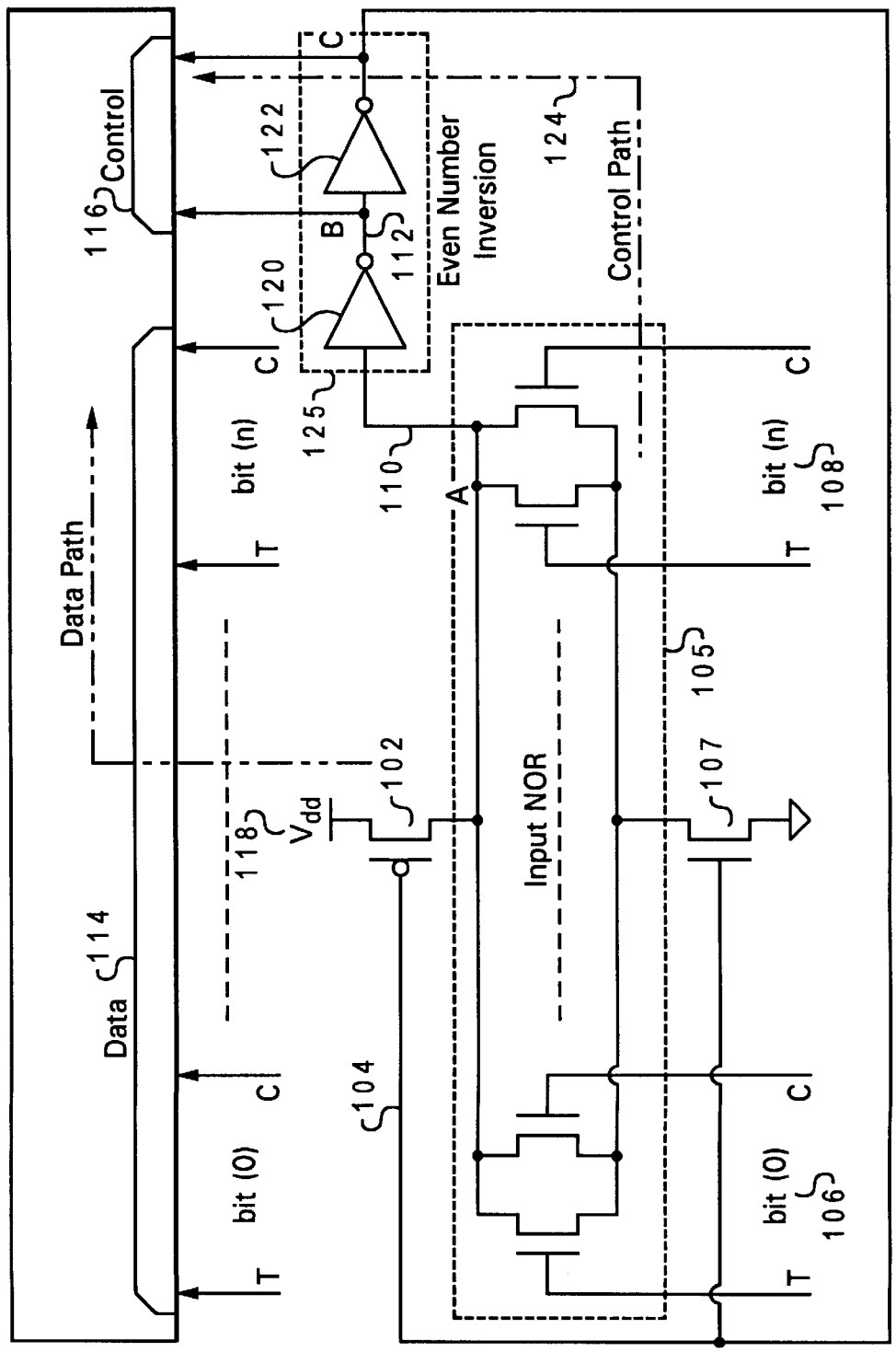
FIG. 1 depicts a conventional input detect circuit for self-resetting (SR) CMOS circuitry.
Figure 2:
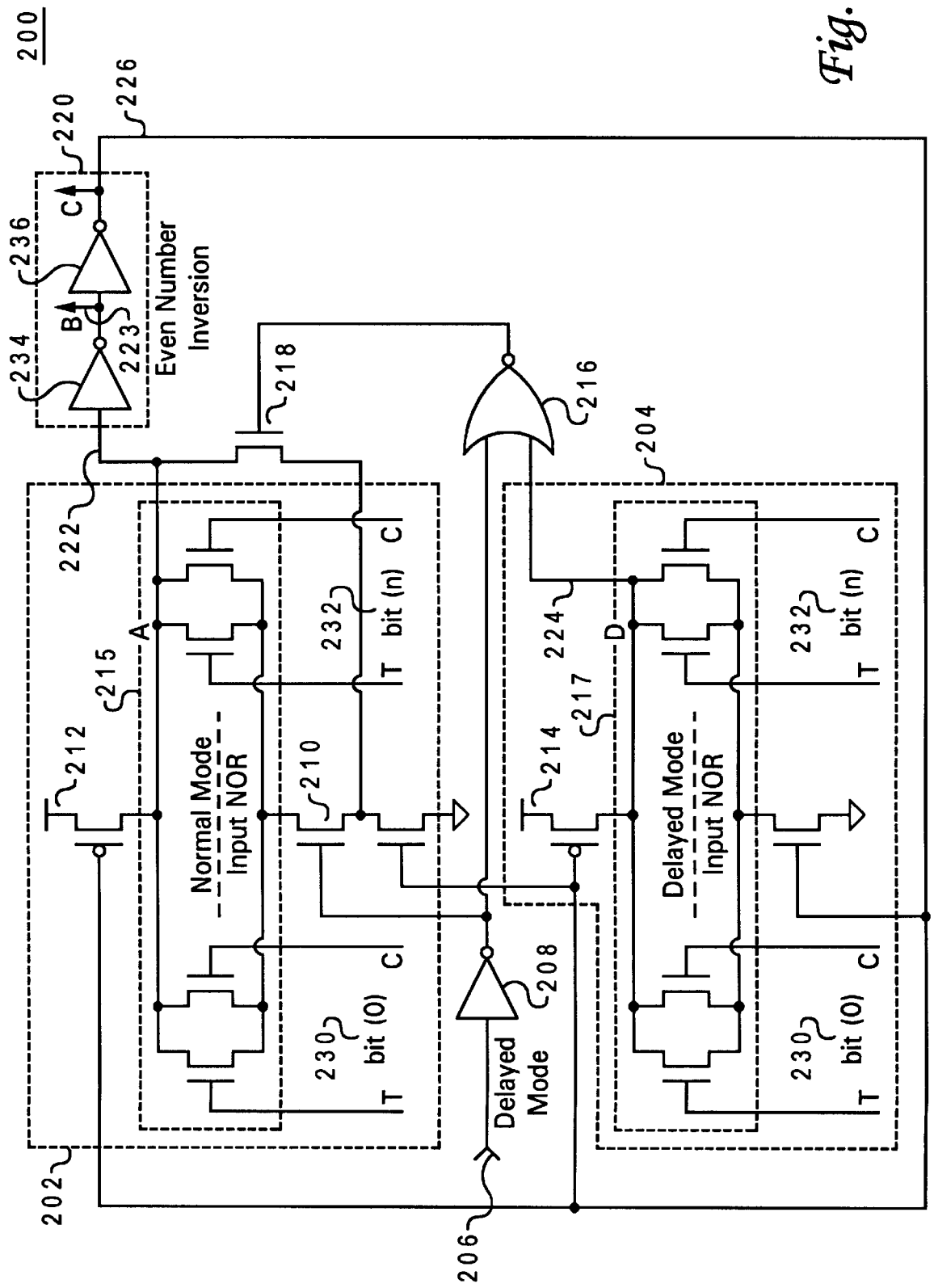
FIG. 2 illustrates an adjustable self-resetting circuit having a selectable delay mode in accordance with one embodiment of the method and system of the present invention.

Turning now to the figures and in particular to FIG. 2, there is illustrated an adjustable self-resetting circuit 200 having a selectable delay mode in accordance with the method and system of the present invention. As depicted in FIG. 2, self-resetting circuit 200 includes a normal-mode input detect circuit 202 and a delay-mode input detect circuit 204. Normal-mode input detect circuit 202 and delay-mode input detect circuit 204 consist of identical dynamic logic input NOR gates which receive input data from one or more of data inputs bit(0) 230 through bit(n) 232.

The dynamic logic circuitry within normal-mode input detect circuit 202 includes an input NOR gate which detects the arrival of one or more of data bits(0) 230 through 232 into self-resetting circuit 200 utilizing input detect node 222 which discharges in response thereto. The detection signal at node 222 is delayed as it propagates through even number inversion module 220, producing a inverted signal 223 and reset signal 226. It should be noted that the delay imparted to the original detection signal at input detect node 222, is a fixed parameter determined in accordance with the design of inverters 234 and 236 which comprise inversion module 220.

As utilized herein "control path" refers to the circuit path traversed by the input detect timing signal which originates at node 222 upon detection of input dynamic data at bit(0) 230 through bit(n) 232. The control path therefore includes inversion module 220 which feeds back to reset signal 226 which is utilized to reset pre-charge transistor 212.

The dynamic circuitry comprising delay-mode input detect circuit 204 is nearly identical to that of its normal-mode counterpart. A delay-mode input NOR gate 217 mirrors NOR gate 215 and detects the same n-bit input data utilizing its own input detect node 224 which discharges in response thereto. The detection signal generated at node 224, however, is not fed directly into the control path for normal-mode input detect circuit 202. Rather than directly propagating through inversion module 220, the detect signal at node 224 is applied as one input of a delay NOR gate 216. During the normal (no-delay) operation of self-resetting circuit 200, the output translation of the detect signal at node 224 through delay NOR gate 216 is disabled by a delay-mode toggle signal 206. In this manner, the control timing signals provided at nodes 223 and 226 are produced utilizing the detection of input data at normal-mode input detect circuit 202. These control timing signals will be delayed with respect to their origination at node 222 in accordance with the design and fabrication of the constituent components of inversion module 220.

Occasionally, process variations in external circuitry or structural anomalies within self-resetting circuit 200 may result in a conflict in the control timing provided by the signals at nodes 223 and 226. In such a case, delay-mode toggle signal 206 may be switched from a logic low to a logic high, such that transistor switch 210 acts as a cutoff switch for normal-mode input detect circuit while simultaneously enabling the transmission of the input detect signal at node 224 through delay NOR gate 216. This signal propagates through two additional devices (delay gate 216 and switching transistor 218) before reaching inversion module 220. Thus, delay-mode toggle signal can be utilized to switch the operating mode of self-resetting circuit 200 when a timing control problem is suspected.

Figure 3:
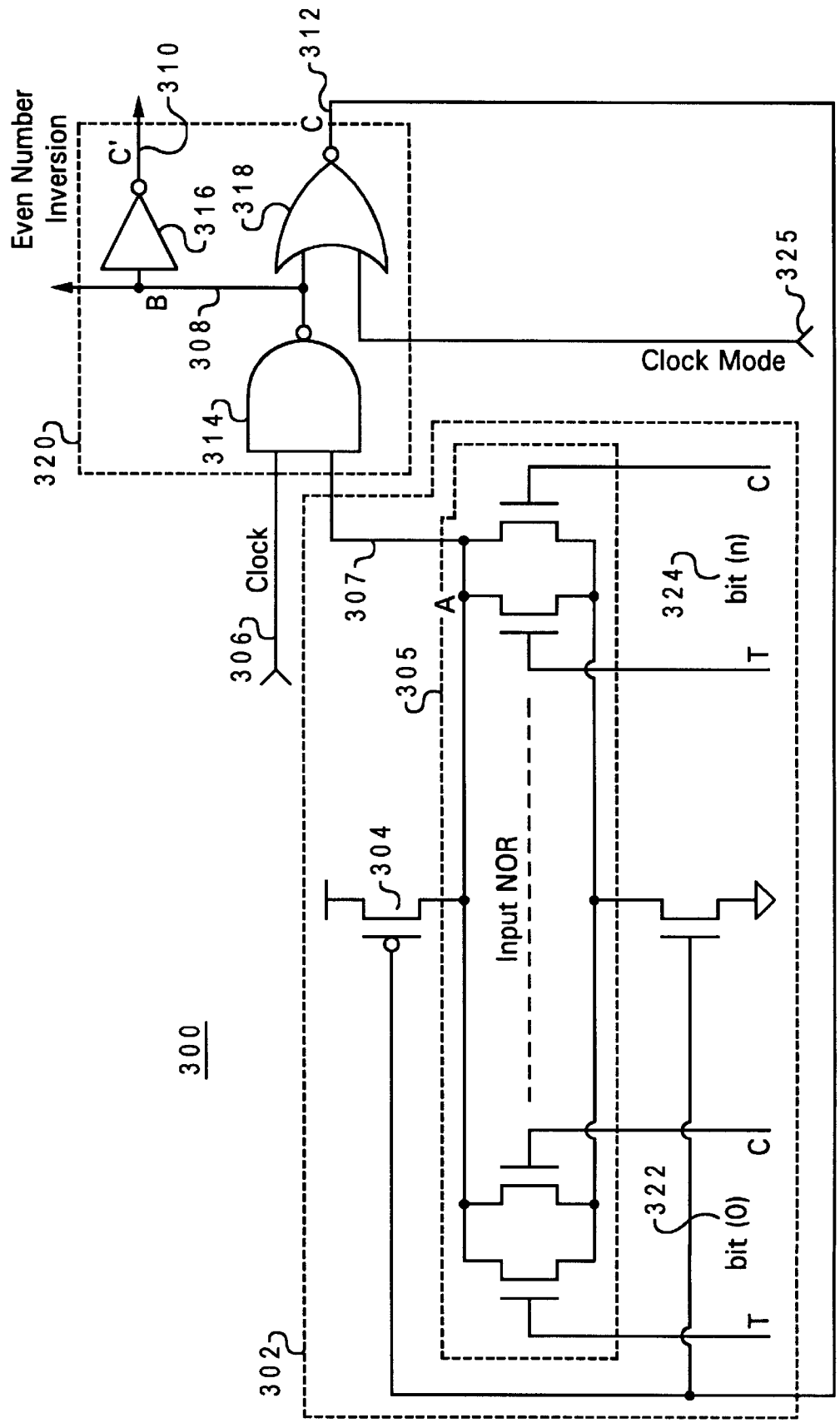
FIG. 3 depicts an alternate embodiment of the present invention wherein a clock mode may replace self-resetting in accordance with the teachings of the present invention.

FIG. 3 depicts an alternate embodiment of the present invention wherein a clock mode may replace self-resetting in accordance with the teachings of the present invention. A timing control circuit 300 having a self-resetting mode of operation and a clock mode of operation is illustrated in FIG. 3. Consistent with the self-resetting circuit embodiment depicted in FIG. 2, timing control circuit 300 provides a means for selecting between the delayed signal from a self-resetting circuit 302 and an alternative timing control signal, such that the data input path originating at timing control circuit 300 may be properly synchronized with the timing control path provided therein.

As seen in FIG. 3, timing control circuit 300 includes self-resetting circuit 302 and an even number inversion buffer circuit 320. In the depicted embodiment, self-resetting circuit 302 is a dynamic logic circuit having an input NOR gate 305 which detects the arrival of input data at bit(0) 322 through bit(n) 324. A pre-charge node 307 discharges upon arrival of input data into NOR gate 305 thus initiating an input detect signal which acts as a timing control signal as it propagates through even number inversion buffer 320.

The selection between the self-resetting mode of operation and clock mode of operation is performed utilizing a clock mode enable circuit within inversion buffer 320. In the illustrated embodiment of FIG. 3, such a clock mode enable circuit would be comprised of a combination of a clock input 306, NAND gate 314, NOR gate 318, an inverter 316, clock input 306, and clock mode enable line 325. Under operating conditions in which properly synchronized timing control signals are being provided at nodes 308 and 312 by self-resetting circuit 302, clock mode enable line 325 is maintained at a logic low. In this manner, timing control signals propagate through both delay gates (NAND 314 and NOR 318) thereby providing self-reset timing signals to external circuitry from nodes 308 and 312.

If, as described with reference to FIG. 2, a timing problem should arise between the timing control path and the data input path, it may be desirable to switch to an alternate timing control mode. Timing control circuit 300 provides such an alternative as embodied by clock input 306. When it is determined that self-resetting control mode is no longer desirable, clock mode enable line 325 is switched from a logic low to a logic high. The resetting/control signal at node 312 will remain at a logic low, thus disabling the timing control signals generated by self-resetting circuit 302. Under this "clock mode" operating condition, clock input 306 will propagate through NAND gate 314 and inverter 316 to produce replacement control signals at nodes 308 and 310 respectively.

While the invention has been particularly shown and described with reference to a preferred embodiment, it will be understood by those skilled in the art that various changes in form and detail may be made therein without departing from the spirit and scope of the invention.

What is claimed is:

1. A self-reset circuit for synchronizing an input data path with a timing control path, said self-reset circuit comprising:
   a normal-mode input detect circuit for detecting an arrival of data from said data input path into said self-reset circuit and generating a normal-mode control signal in response thereto;
   a delay-mode input detect circuit for detecting said arrival of said data from said data input path into said self-reset circuit and generating a delay-mode control signal in response thereto; and
   a toggle circuit for selectively enabling either said normal-mode input detect circuit or said delay-mode input detect circuit, such that said delay-mode control signal synchronizes said timing control path with respect to said data input path.

2. The self-reset circuit of claim 1, further comprising a delay gate through which said delay-mode control signal propagates only in response to said toggle circuit enabling said delay-mode input detect circuit.

3. The self-reset circuit of claim 1, wherein said normal-mode input detect circuit is a dynamic logic circuit comprising a pull-down network for receiving said data, and a pre-charge node for sensing and translating said arrival of said data into said normal-mode control signal.

4. The self-reset circuit of claim 2, wherein said delay-mode input detect circuit is identical to said normal-mode input detect circuit.

5. The self-reset circuit of claim 3, wherein said normal-mode control signal is applied to an even number inversion buffer sequence.

6. The self-reset circuit of claim 4, wherein said toggle circuit further comprises a delay-mode enabling signal.

7. The self-reset circuit of claim 5, wherein said delay gate comprises a NOR gate having a sensing input coupled to the pre-charge node of said delay-mode input detect circuit and an enabling input coupled to said delay-mode enabling signal.

8. The self-reset circuit of claim 6, wherein the pull-down network of said normal-mode input detect circuit comprises a cutoff switching for disabling said normal-mode input detect circuit, and wherein said delay-mode enabling signal is coupled to said cutoff switch.

9. A timing control circuit having a self-resetting mode of operation and a clock mode of operation for synchronizing an data input path with a timing control path, said timing control circuit comprising:
   a self-resetting circuit for detecting an arrival of input data from said data input path and generating a timing control signal in response thereto during said self-reset mode of operation;
   a clock input applied to said timing control path for generating a timing control signal during said clock mode; and
   a clock mode enable circuit for switching the operating mode of said timing control circuit between said self-resetting mode and said clock mode, such that said timing control signal may properly synchronize said data input path and said timing control path.

10. The timing control circuit of claim 8, wherein said self-resetting circuit is a dynamic logic circuit comprising a pull-down network for detecting an arrival of input data, and a pre-charge node for sensing and translating said arrival of said data into a timing control signal.

11. The timing control circuit of claim 9, wherein said timing control signal from said pre-charge node is applied to said timing control path comprising an even number inversion buffer circuit.

12. The timing control circuit of claim 10, wherein said even number inversion buffer circuit comprises:
   a NAND gate generating an inverted timing control signal; and
   a NOR gate receiving said inverted timing control signal and producing a self-resetting signal in response thereto.

13. The timing control circuit of claim 11, wherein said clock input is applied to said NAND gate within said even number inversion buffer circuit.

14. The timing control circuit of claim 11, wherein said clock mode enable signal is applied to said NOR gate within said even number inversion buffer circuit, such that said self-resetting signal may be selectively disabled.

* * * * *